United States Patent
Jeong

(10) Patent No.: US 7,245,537 B2
(45) Date of Patent: Jul. 17, 2007

(54) NONVOLATILE MEMORY DEVICE AND METHOD OF PROGRAMMING SAME

(75) Inventor: Jae-Yong Jeong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/106,640

(22) Filed: Apr. 15, 2005

(65) Prior Publication Data
US 2006/0087888 A1   Apr. 27, 2006

(30) Foreign Application Priority Data
Oct. 26, 2004   (KR) .................. 10-2004-0085748

(51) Int. Cl.
*G11C 11/34* (2006.01)
(52) U.S. Cl. .................. 365/185.22; 365/185.18
(58) Field of Classification Search .......... 365/185.22, 365/185.18
See application file for complete search history.

(56) References Cited

U.S. PATENT DOCUMENTS

| | | | |
|---|---|---|---|
| 5,712,815 A | * | 1/1998 | Bill et al. ............ 365/185.03 |
| 5,805,501 A | * | 9/1998 | Shiau et al. .......... 365/185.29 |
| 6,115,313 A | * | 9/2000 | Pio ....................... 365/228 |
| 2003/0154230 A1 | * | 8/2003 | Harada et al. ........ 708/801 |

FOREIGN PATENT DOCUMENTS

| | | |
|---|---|---|
| JP | 11-328981 | 11/1999 |
| KR | 1020000027300 A | 5/2000 |
| KR | 1020010018711 A | 3/2001 |
| KR | 1020020055253 A | 7/2002 |

* cited by examiner

*Primary Examiner*—Michael Tran
(74) *Attorney, Agent, or Firm*—Volentine & Whitt, PLLC

(57) ABSTRACT

A nonvolatile memory device and method of programming the device are disclosed. The nonvolatile memory device is adapted to interrupt or resume a programming operation for a memory cell of the device in response to variation in a programming voltage being supplied to the memory cell. The programming operation is typically interrupted or resumed in response to signals generated by a program controller and/or a detector monitoring the programming voltage.

18 Claims, 6 Drawing Sheets

(Vt : VBL detecting level)

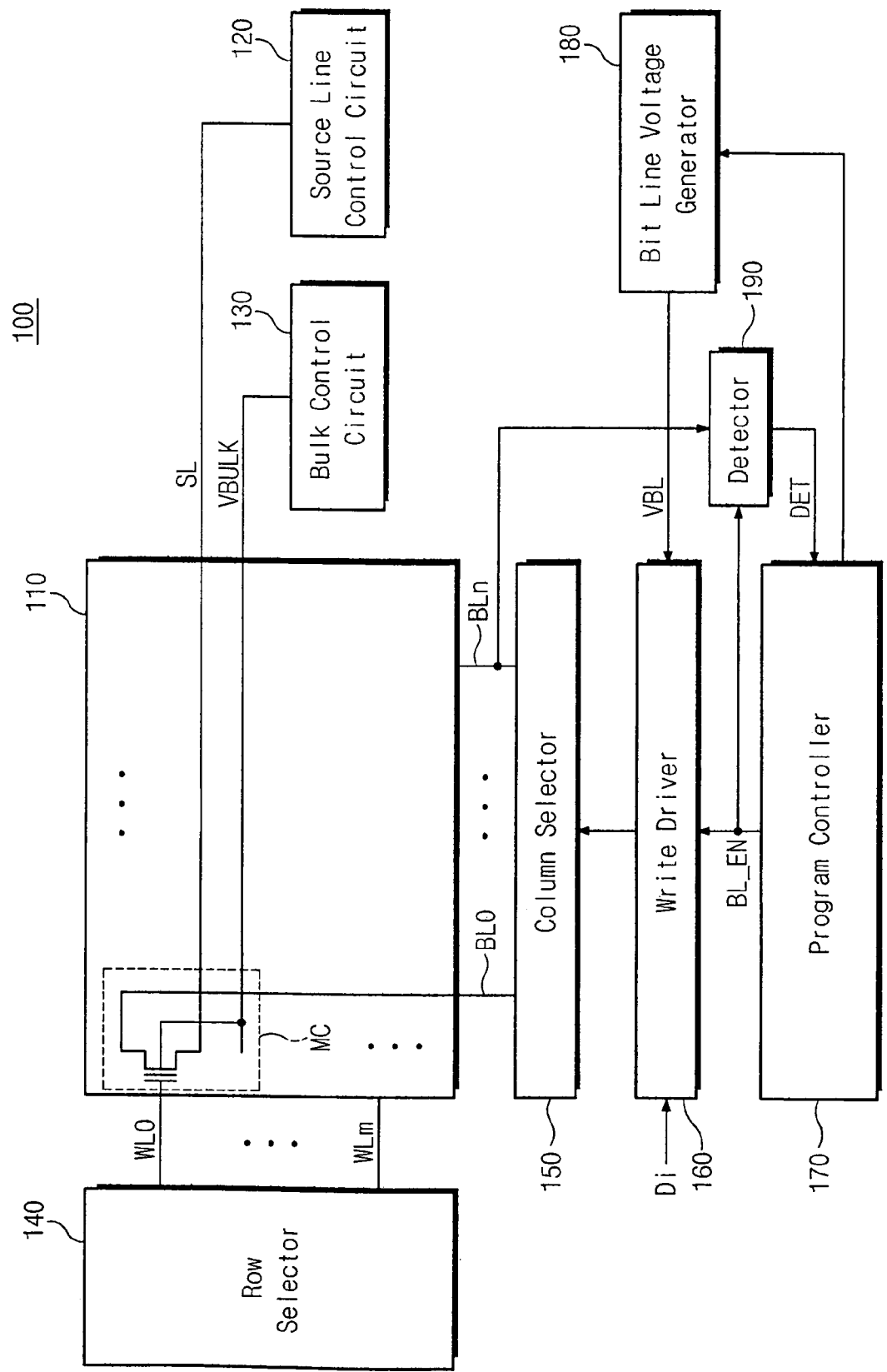

NONVOLATILE MEMORY DEVICE AND METHOD OF PROGRAMMING SAME

BACKGROUND OF THE INVENTION

1. Field of the Invention

The present invention relates generally to a memory device, and more particularly to a nonvolatile memory device and a method of programming the same.

A claim of priority is made to Korean Patent Application No. 2004-85748 filed on Oct. 26, 2004, the disclosure of which is hereby incorporated by reference in its entirety.

2. Description of the Related Art

Semiconductor memories are an essential part of most modern electronic systems such as computers and other digital logic platforms. Unfortunately, however, the performance of the electronic systems is often limited by the speed and the capacity of the semiconductor memories. In addition, the physical size of memory chips often places a restriction on the amount of miniaturization that can take place in the electronic systems. Because of the limiting effect that semiconductor memories have on modern electronic systems, there is a continuing need to create faster, more highly integrated semiconductor memories. In order to do so, improvements need to be made to the manufacturing technologies used to create these memories. In particular, processing techniques for creating more densely integrated, higher frequency semiconductor memories need to be developed.

Semiconductor memory devices are generally grouped into two broad categories: volatile semiconductor memory devices and nonvolatile semiconductor memory devices. Briefly, volatile semiconductor memory devices provide persistent data storage as long as power is supplied to the devices, but they lose the data once the power is cut off. Nonvolatile semiconductor memory devices, on the other hand, provide persistent data storage even when power to the devices is cut off or suspended.

Because of their ability to provide persistent data storage even when power is cut off, nonvolatile memory devices are commonly used to provide long term storage for data such as program files and microcode. Nonvolatile memory devices are frequently used in application areas such as personal computers, aerospace electronic engineering, communication systems, and consumer electronics.

Some nonvolatile semiconductor memories are adapted for reprogramming and others are not. For example, due to design limitations, mask-programmed read-only memory (MROM) and programmable read-only memory (PROM) can be programmed only once during their lifetime. Erasable programmable read-only memory (EPROM) can be reprogrammed, but only after exposing it to ultraviolet light for several minutes to erase previously stored data. Electrically erasable programmable read-only memory (EEPROM), on the other hand, provides efficient reprogramming capability by allowing memory cells to be reprogrammed by simply applying electric fields to the cells. EEPROMs can generally be reprogrammed more than one hundred thousand times during their lifetime.

Flash memory is a special type of EEPROM in which multiple memory blocks are erased or programmed by a single programming operation. The performance of flash memory is generally superior to that of normal EEPROM, which only allows one memory block to be erased or programmed at a time. In addition, flash memory provides fast access times for read operations and is resistant to physical shock, thus making it an attractive option for high performance portable devices such as cellular phones and personal digital assistants (PDAs).

A typical flash memory comprises an array of transistors called cells, wherein each cell has a source and a drain formed on a substrate and two gate structures formed on the substrate between the source and the drain terminals. The two gate structures generally comprise a floating gate surrounded by an insulating layer and a control gate formed on the floating gate. The floating gate is used to store electrons determining a logic state for the cell.

A flash memory cell is read by placing a voltage on its control gate and detecting whether a current flows between its drain and source. Depending on how many electrons are stored in the floating gate, the voltage applied to the control gate will either allow current to flow between the drain and the source or it will not. For example, where a large number of electrons is stored in the floating gate, the electrons have a canceling effect on the voltage applied to the control gate, thereby affecting whether current flows between the drain and the source. In other words, the electrons stored in the floating gate modify the threshold voltage of the cell, i.e. the voltage that has to be applied to the control gate in order for current to flow between the drain and the source.

Due to variations in flash memory cells such as their geometry or a voltage used to program the memory cells, there tends to be variation in the threshold voltages of flash memory cells that have been programmed. Where the variation in the threshold voltages of the memory cells is not properly regulated, it can cause the flash memory to have poor performance.

In order to regulate a threshold voltage distribution for programmed memory cells, the memory cells are generally programmed using an incremental step pulse programming (ISPP) scheme such as that illustrated by FIG. 1. Referring to FIG. 1, a programming voltage $V_{WL}$ is applied to a wordline. Programming voltage $V_{WL}$ is increased in multiple programming loop iterations executed during a programming operation. Each programming loop comprises a programming period and a program verifying period. In each programming loop, programming voltage $V_{WL}$ is incremented by an amount $\Delta V$. During the programming operation, a threshold voltage Vt of a cell being programmed increases by amount $\Delta V$ in each programming loop. In order to minimize variation in the threshold voltage distribution, amount $\Delta V$ should be small. As increment $\Delta V$ becomes smaller, the number of programming loops becomes larger. Since there is a tradeoff between the number of programming loops required and the variance of the threshold voltage distribution, $\Delta V$ should be chosen to minimize the variance of the threshold voltage as much as possible without significantly limiting the performance of the memory device by requiring too many programming loops.

A programming scheme for a nonvolatile memory device is disclosed, for example, in U.S. Pat. No. 6,266,270. Circuits for generating programming voltages are disclosed, for example, in U.S. Pat. No. 5,642,309 and in Korean Patent Publication No. 2002-39744.

In programming a NOR flash memory device using the ISPP scheme, a wordline voltage of 10V is applied to the control gate of a flash memory cell, a bitline voltage of 5~6V is applied to the drain of the flash memory cell, and a voltage less than 0V (e.g., −1V) is applied to the bulk (or substrate) of the flash memory cell. In general, a current $I_{cell}$ flowing through the flash memory cell is $(V_{GS}-Vt)^2$, where Vt is proportional to a threshold voltage of the flash memory cell and $V_{GS}$ is a gate-to-source voltage of the flash memory cell.

The bitline voltage is typically generated and maintained by a charge pump. Where the value of current $I_{cell}$ is larger than the capacity of the charge pump generating the bitline voltage, the bitline voltage is reduced. Where the bitline voltage is reduced beyond a certain amount, the threshold voltage of the flash memory cell fails to increase to a desired level during a programming operation, as indicated by a broken line in FIG. 1. Under these conditions, the difference between the wordline voltage and the threshold voltage becomes progressively larger as more programming loop iterations are executed using the ISPP scheme. As a result, the quality of programming gradually degrades to the point where programming failures occur.

What is needed, therefore, is a way to prevent programming failures from occurring due to a drop in the bitline voltage.

SUMMARY OF THE INVENTION

The present invention provides a nonvolatile memory device and a method of programming the nonvolatile memory device. Embodiments of the present invention are adapted to suspend and resume a programming operation for a memory device in response to a varying voltage level of a programming voltage supplied to a memory cell, thereby preventing programming failures which occur due to a drop in the programming voltage.

According to one embodiment of the present invention, a method of programming a nonvolatile memory device comprises supplying a programming voltage to a selected memory cell, and interrupting the supply of the programming voltage to the selected memory cell whenever the programming voltage drops below a detection voltage.

According to another embodiment of the present invention, a nonvolatile memory device comprises a memory cell, a programing voltage generator supplying a programming voltage to the memory cell during a programming operation, and a program controller regulating the programming voltage generator to interrupt the supply of the programming voltage to the memory cell in accordance with variation in the programming voltage.

According to still another embodiment of the present invention, nonvolatile memory device comprises a memory cell array including memory cells arranged in rows and columns and a column selector partially selects the columns. The nonvolatile memory device further comprises a bitline voltage generator generating a bitline voltage during a programming operation, a write driver activating the selected columns with the bitline voltage in response to a bitline enable signal, a detector sensing whether the bitline voltage is lower than a detection voltage during the programming period, and a program controller generating the bitline enable signal in response to an output of the detector.

BRIEF DESCRIPTION OF THE DRAWINGS

The invention is described below in relation to several embodiments illustrated in the accompanying drawings. Throughout the drawings, like reference numbers indicate like exemplary elements, components, or steps. In the drawings.

DESCRIPTION OF THE EXEMPLARY EMBODIMENTS

Exemplary embodiments of the invention are described below with reference to the corresponding drawings. These embodiments are presented as teaching examples. The actual scope of the invention is defined by the claims that follow.

In the description, the terms "activate", "activated", "inactivate", and "inactivated" are used to describe distinct logical states for electrical signals. A signal is said to be "activated" when it has a first logic level and "inactivated" when it has a second logic level which is distinct from the first logic level. The terms "activate" and "inactivate" denote transitions between the first and second logic states i.e. "activate" denotes a transition from the second logic level to the first logic level and "inactivate" denotes a transition from the first logic level to the second logic level. Typically, the first logic level is a "high" logic level, or a logical "1" and the second logic level is a "low" logic level, or a logical "0".

Figure 1:
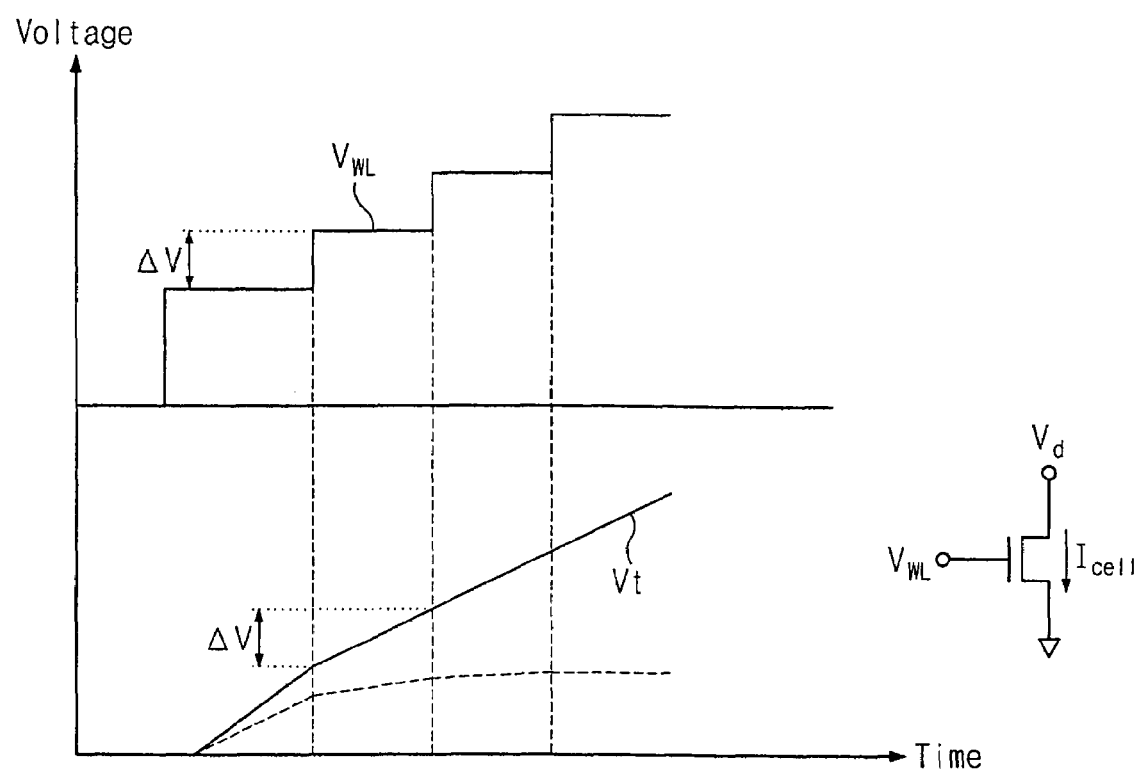
FIG. 1 is a graph showing variation in wordline and threshold voltages during a programming operation of a nonvolatile memory device.
Figure 2:
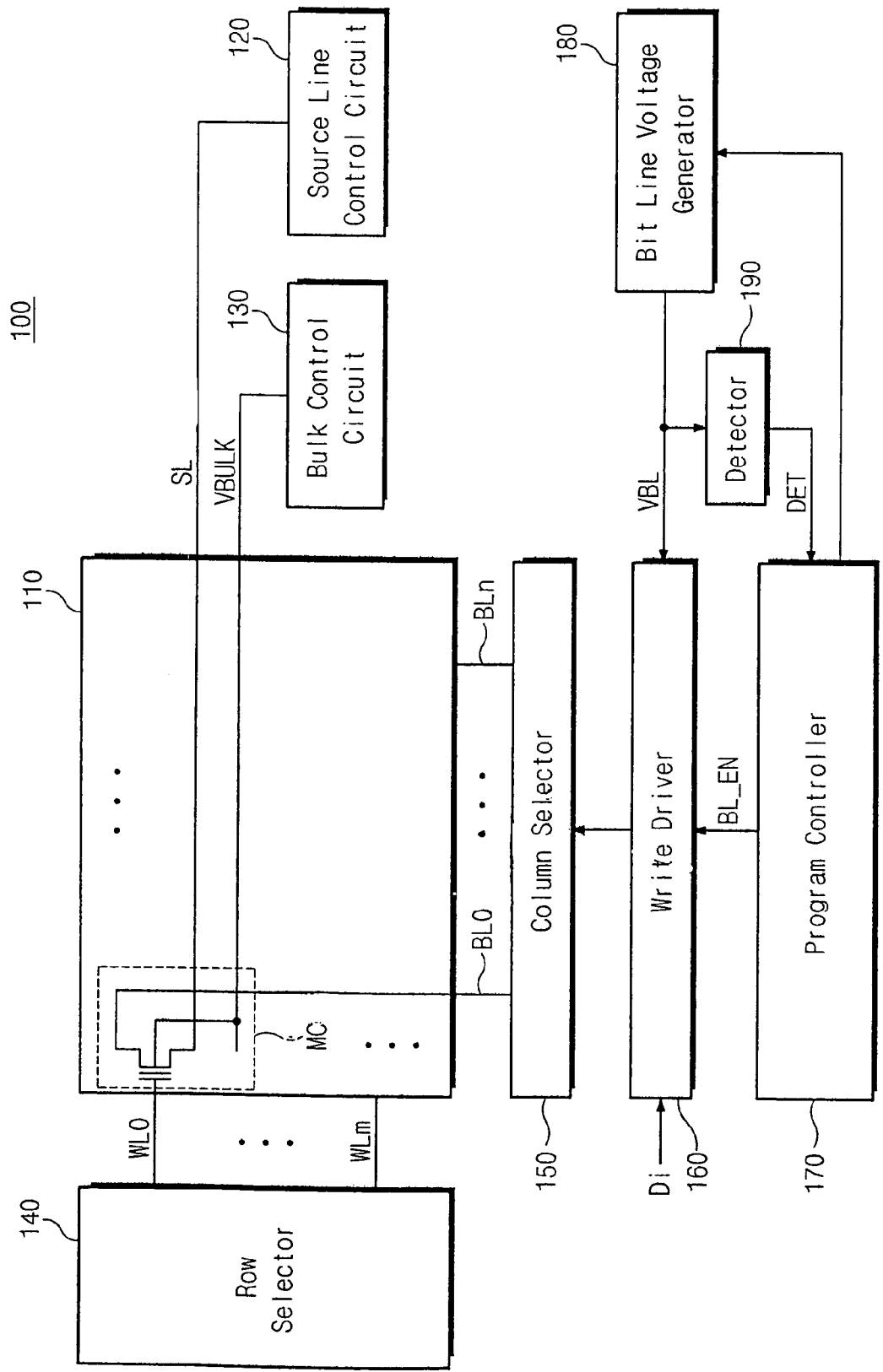
FIG. 2 is a block diagram illustrating a nonvolatile memory device according to one embodiment of the invention.

FIG. 2 is a block diagram illustrating a nonvolatile memory device according to one embodiment of the present invention. The nonvolatile memory device illustrated in FIG. 2 is a NOR flash memory, but the inventive principles described in relation to the NOR flash memory can be applied to other types of nonvolatile memory devices, such as MROM, PROM, ferroelectric random access memory (FRAM), NAND flash memory, and so forth.

Referring to FIG. 2, a nonvolatile memory device 100 comprises a memory cell array 110 comprising memory cells arranged in a matrix of rows (or wordlines) and columns (or bitlines). For clarity of illustration, FIG. 2 shows only one memory cell MC. Memory cell MC is formed of a floating gate transistor comprising a floating gate, a control gate, a bulk (or substrate), a source, and a drain. The control gate of the floating gate transistor is connected to a wordline WL0, the drain of the floating gate transistor is connected to a bitline BL0, and the source of the floating gate transistor is connected to a source line SL.

Source line SL is controlled by a source line control circuit 120 (or source voltage generating circuit). Source line SL is typically inactivated during reading and programming operations, and assumes a floating logic state during an erase operation. The bulk of the floating gate transistor is connected to a bulk control circuit 130 supplying a bulk voltage VBULK. Bulk voltage VBULK typically has a value of −1V or 0V during a programming operation. Although not shown in the drawings, memory cell array 110 contains other memory cells having a configuration similar to that of memory cell MC.

A row selector 140 selects one of a plurality of wordlines WL0~WLm according to predetermined row address information and drives the selected word line with a wordline voltage corresponding to a particular operating mode. A column selector 150 selects a predetermined number (e.g., byte or word) of bitlines BL0~BLn according to predetermined column address information. A write driver 160 operates in response to a bitline enable signal BL EN provided by a program controller 170. Write driver 160 drives the selected bitlines with a bitline voltage VBL supplied by a bitline voltage generator 180, according to input data Di during a programming operation of memory cell array 110. For example, during a programming operation of memory cell array 110, write driver 160 supplies selected bitlines designated by column selector 150, with bitline voltage VBL during a period where bitline enable signal BL EN is active. Here, bitline enable signal BL EN is defined to be "active" whenever it has a logic level that allows the bitlines to be driven. During periods where memory cell array 110 is not being programmed, write driver 160 supplies the selected bitlines designated by column selector 150 with a voltage (e.g., ground) which is lower than bitline voltage VBL. Program controller 170 causes bitline enable signal BL EN to be active whenever memory cell array 110 is being programmed.

Still referring to FIG. 2, bitline voltage generator 180 is controlled by program controller 170. Bitline voltage generator 180 may be implemented with a conventional charge pump. A detector 190 detects whether bitline voltage VBL is lower than a detection voltage. The detection voltage is generally lower than a target voltage for bitline voltage VBL. Where bitline voltage VBL falls below the detection voltage, detector 190 activates a detection signal DET. Where bitline voltage VBL rises above the detection voltage, detector 190 inactivates detection signal DET. In other words, detection signal DET assumes different logic states according to whether bitline voltage VBL is above or below the detection voltage.

Program controller 170 controls bitline enable signal BL EN in response to detection signal DET. For example, where detection signal DET is activated, program controller 170 inactivates bitline enable signal BL EN. Where detection signal DET is inactivated, program controller 170 activates bitline enable signal BL EN. Where bitline enable signal BL EN is inactivated, write driver 160 temporarily stops supplying bitline voltage VBL to selected the bitlines. Since this interrupts consumption of cell current, bitline voltage VBL recovers to the target voltage. Once bitline voltage VBL again rises above the detection voltage, detector 190 inactivates detection signal DET. As a result, program controller 170 activates bitline enable signal BL EN in response to the inactivation of detection signal DET and write driver 160 supplies bitline voltage VBL to the selected bitline.

Where bitline voltage VBL falls below the detection voltage, a programming operation is temporarily suspended. The programming operation is resumed after bitline voltage VBL again rises above the detection voltage. In other words, a nonvolatile memory device according to the present invention is controlled to suspend or resume programming operations according to variation in the bitline voltage.

Taken together, column selector 150, write driver 160, bitline voltage generator 180, and detector 190 constitute a programming voltage supply circuit providing bitline voltage VBL for memory cell array 110 during programming operations.

Figure 3:
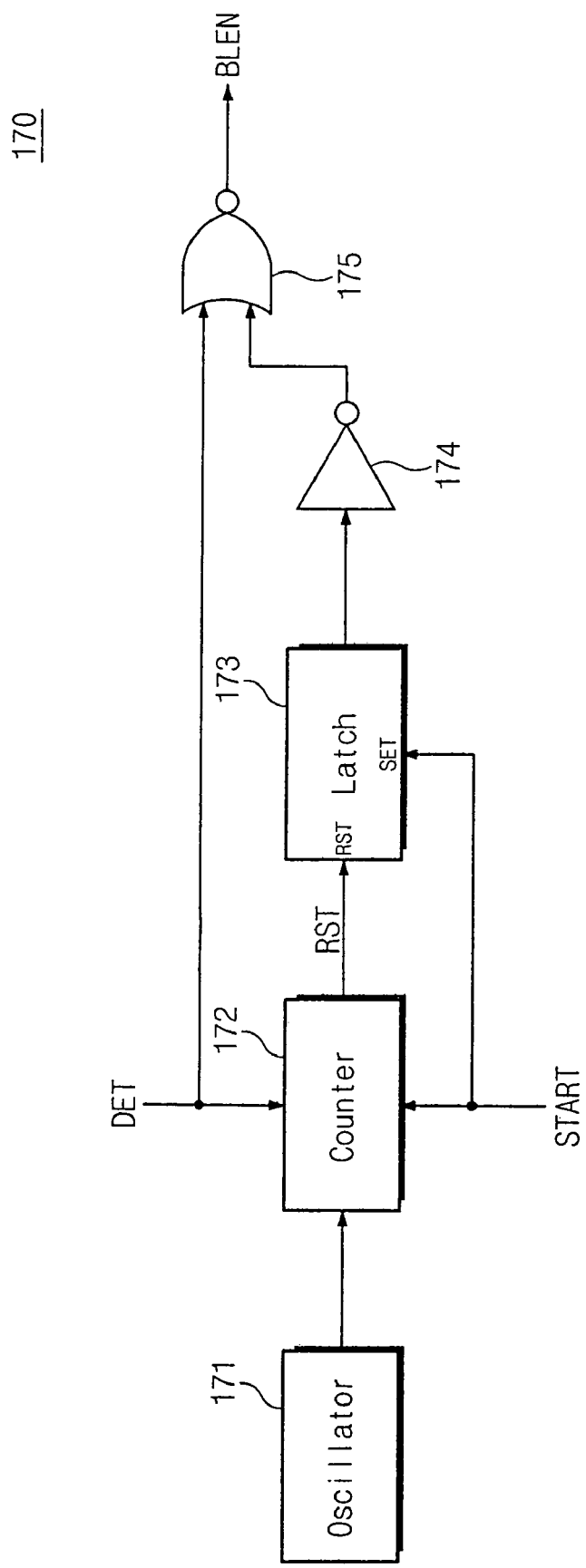
FIG. 3 is a block diagram illustrating an embodiment of a program controller shown in FIG. 2.

FIG. 3 is a block diagram illustrating an embodiment of program controller 170 shown in FIG. 2. Referring to FIG. 3, program controller 170 comprises an oscillator 171, a counter 172, a latch 173, an inverter 174, and a NOR gate 175. Counter 172 is initialized by a program start signal START and it conducts a counting operation in response to an output of oscillator 171. When counter 172 reaches a predetermined value, counter 172 outputs a reset pulse signal RST to latch 173.

Operation of counter 172 is suspended when detection signal DET is activated. In other words, counter 172 does not count whenever detection signal DET is activated but it does count whenever detection signal DET is inactivated. An output of latch 173 is activated in response to program start signal START, which is activated at the beginning of a programming operation, and the output of latch 173 is inactivated by reset pulse signal RST. NOR gate 175 outputs the bitline enable signal BL EN in response to detection signal DET and the output signal of inverter 174.

Figure 4:
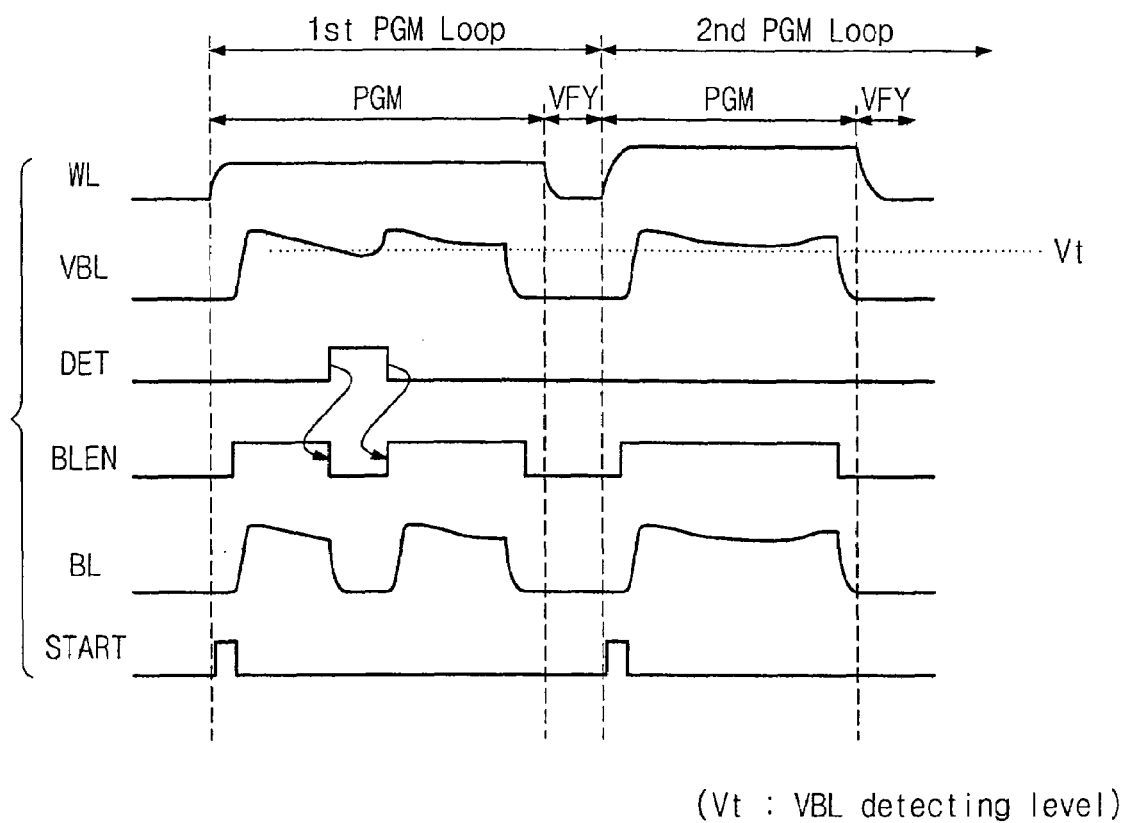
FIG. 4 is a waveform timing diagram illustrating a programming operation for a nonvolatile memory device according to an embodiment of the present invention.

FIG. 4 is a waveform timing diagram for a programming operation of the nonvolatile memory device according to an embodiment of the present invention. Referring to FIG. 4, a programming operation for the nonvolatile memory device comprises a plurality of programming loops. Each programming loop comprises a programming period PGM and a program verifying period VFY.

In a nonvolatile memory device using the ISPP scheme, a wordline voltage is gradually increased by a predetermined amount with each successive programming loop. In a nonvolatile memory device not using the ISPP scheme, the wordline voltage is maintained at a constant level throughout successive programming loops.

Where a programming command is input to the nonvolatile memory device, the wordline voltage, the bitline voltage, and the bulk voltage are provided by conventional voltage generators. During a first programming loop, labeled 1st PGM Loop, program start signal START is activated and row selector 140 drives a selected wordline with a wordline voltage WL shown in FIG. 4. Bulk voltage VBULK is applied to the bulk of the memory cell by bulk control circuit 130. In response to the activation of the program start signal START, program controller 170 activates bitline enable signal BL EN. In response to the activation of program start signal START, counter 172 is initialized. Counter 172 begins its counting operation in response to an output signal (e.g., an oscillation signal) from oscillator 171. In response to bitline enable signal BL EN, write driver 160 drives selected bitline(s) with bitline voltage VBL. Under the these conditions, the selected memory cell(s) begins to be programmed.

During programming of the memory cell, bitline voltage VBL may fall below detection voltage Vt because of cell current consumed by the programming operation. Where bitline voltage VBL falls below detection voltage Vt, detector 190 activates detection signal DET. Where detection signal DET is activated, the operation of counter 172 is suspended and therefore counter 172 retains its current value. As a result of detection signal DET becoming activated, bitline enable signal BL EN is inactivated. In response to the inactivation of bitline enable signal BL EN, write driver 160 suspends the supply of bitline voltage VBL to the selected bitline. In other words, the programming operation is temporarily suspended during the first programming loop shown in FIG. 4.

As the supply of bitline voltage VBL is interrupted, bitline voltage VBL is boosted to the target voltage by bitline voltage generator 180. While bitline voltage VBL is being boosted to the target voltage, detector 190 checks whether bitline voltage VBL is higher than detection voltage Vt. Where bitline voltage VBL rises above detection voltage Vt, detector 190 inactivates detection signal DET. In response to the inactivation of detection signal DET, the output signal of NOR gate 175, i.e., bitline enable signal BL EN is activated. In response to the activation of bitline enable signal BL EN, write driver 160 drives the selected bitline(s) with bitline voltage VBL, resuming the programming operation.

In response to the inactivation of detection signal DET, counter 172 resumes counting. Where a value of counter 172 reaches a predetermined value, counter 172 activates reset pulse signal RST. The output of latch 173 is inactivated in response to the activation of reset pulse signal RST. In response to the inactivation of the output signal of latch 173, bitline enable signal BL EN is inactivated. After the voltage applied to the word line is discharged, the programming operation PGM of the first programming loop is terminated and the program verifying operation VFY of the first programming loop begins.

As stated above, a drop in bitline voltage VBL during the programming period frequently leads to programming failures. In order to prevent such programming failures, the programming operation is suspended whenever bitline voltage VBL falls below detection voltage Vt. Where bitline voltage VBL again rises above detection voltage Vt, the programming operation resumes. Such mechanisms for suspending and resuming the programming operation allow the threshold voltage of the memory cell to be incremented by predetermined amount during every programming period. Thus, the quality of programming is improved.

Figure 5:
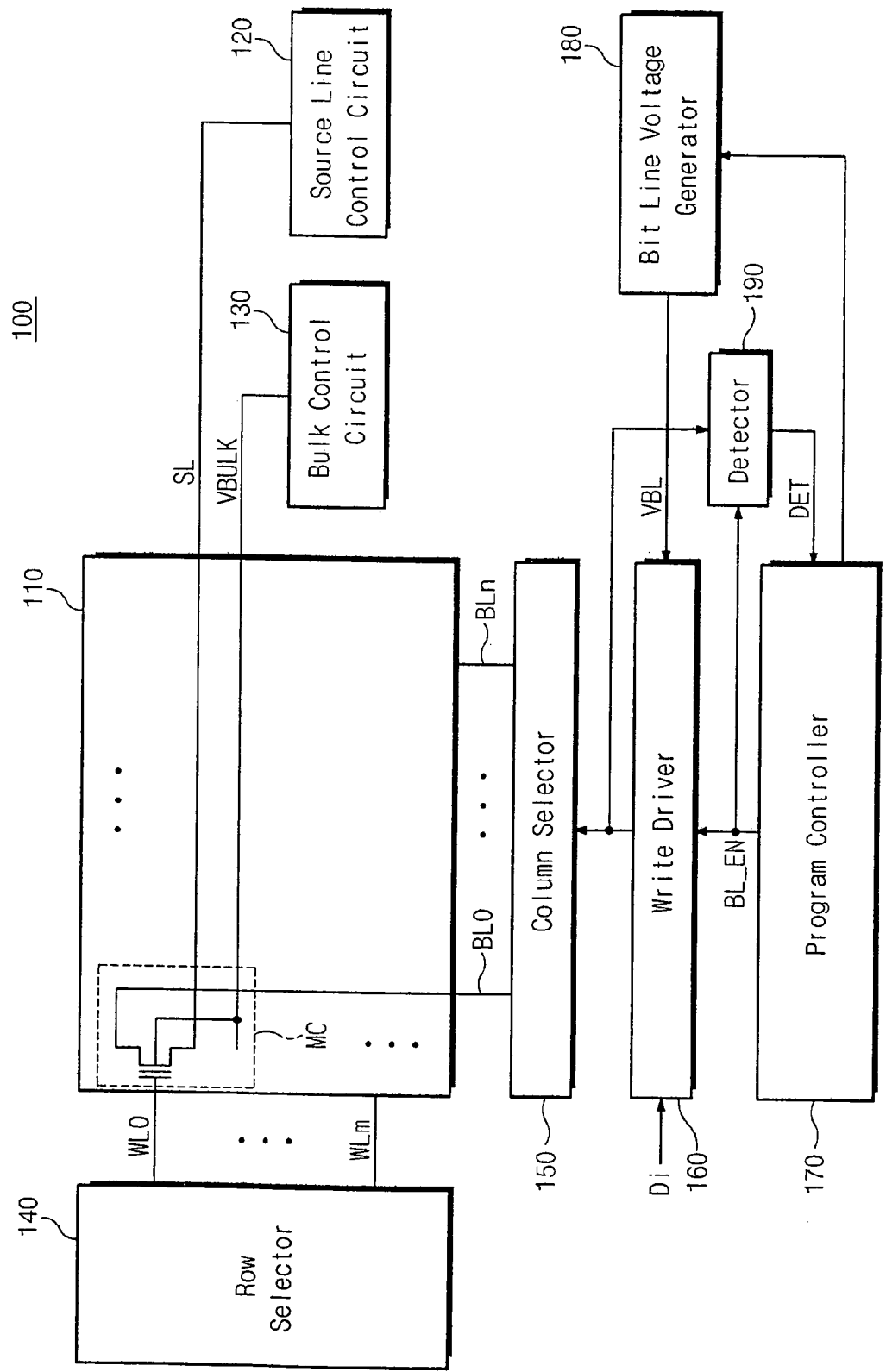
FIG. 5 is a block diagram illustrating a nonvolatile memory device according to another embodiment of the invention; and, FIG. 6 is a block diagram illustrating a nonvolatile memory device according to a still another embodiment of the invention.

Detector 190 illustrated in FIG. 2 is adapted to sense bitline voltage VBL supplied to write driver 160. However, in other embodiments of the invention, detector 190 performs its sensing function at different portions of the memory device. For example, as shown in FIG. 5, detector 190 can sense a drop in bitline voltage VBL by receiving and monitoring the output of write driver 160. Alternatively, as shown in FIG. 6, detector 190 may be adapted to sense a drop in bitline voltage VBL by receiving and monitoring the output of column selector 150.

The foregoing preferred embodiments are teaching examples. Those of ordinary skill in the art will understand that various changes in form and details may be made to the exemplary embodiments without departing from the scope of the present invention which is defined by the following claims.

What is claimed:

1. A method of programming a nonvolatile memory device, the method comprising:
   supplying a bitline voltage to a selected memory cell;
   interrupting the supply of the bitline voltage to the selected memory cell whenever the bitline voltage drops below a detection voltage; and
   resuming the supply of the bitline voltage to the selected memory cell when the bitline voltage rises above the detection voltage.

2. The method of claim 1, wherein the bitline voltage is supplied by a bitline voltage generator.

3. The method of claim 1, wherein the bitline voltage is output by a write driver.

4. The method of claim 1, wherein the bitline voltage is a voltage on a bitline.

5. A nonvolatile memory device comprising:
   a memory cell;
   a programming voltage supply circuit supplying a bitline voltage to the memory cell during a programming operation; and,
   a program controller regulating the programming voltage supply circuit to interrupt the supply of the bitline voltage to the memory cell in response to the bitline voltage dropping below a detection voltage during the programming operation, and to resume the supply of the bitline voltage in response to the bitline voltage rising above a detection voltage during the programming operation.

6. The nonvolatile memory device of claim 5, wherein the program controller is adapted to generate a bitline enable signal during the programming operation.

7. The nonvolatile memory device of claim 6, wherein the programming voltage supply circuit comprises:
   a bitline voltage generator outputting the bitline voltage;
   a write driver supplying the bitline voltage to the memory cell in response to the bitline enable signal; and,
   a detector sensing whether the bitline voltage is lower than the detection voltage;
   wherein the program controller regulates activation and inactivation of the bitline enable signal in accordance with a result from the detector during the programming operation.

8. The nonvolatile memory device of claim 7, wherein the program controller inactivates the bitline enable signal to interrupt the supply of the bitline voltage in response to the bitline voltage falling below the detection voltage during the programming operation.

9. The nonvolatile memory device of claim 7, wherein the program controller activates the bitline enable signal to resume the supply of the bitline voltage in response to the bitline voltage rising above the detection voltage during the programming operation.

10. The nonvolatile memory device of claim 7, wherein the detector senses the bitline voltage output from the bitline voltage supply circuit.

11. The nonvolatile memory device of claim 7, wherein the detector senses the bitline voltage output by the write driver.

12. A nonvolatile memory device, comprising:
    a memory cell array including memory cells arranged in rows and columns;
    a column selector partially selecting the columns;
    a programming voltage supply circuit generating a bitline voltage during a programming operation;
    a write driver activating the selected columns with the bitline voltage in response to a bitline enable signal;
    a detector sensing whether the bitline voltage is lower than a detection voltage during the programming period; and,
    a program controller generating the bitline enable signal in response to an output of the detector.

13. The nonvolatile memory device of claim 12, wherein the program controller activates the bitline enable signal in response to a beginning of the program operation.

14. The nonvolatile memory device of claim 13, wherein the program controller inactivates the bitline voltage to interrupt the supply of the bitline voltage in response to the bitline voltage falling below a detection voltage during the programming period.

15. The nonvolatile memory device of claim 14, wherein the program controller activates the bitline enable signal to resume the supply of the bitline voltage in response to the bitline voltage rising above the detection voltage during the programming period.

16. The nonvolatile memory device of claim 12, wherein the detector monitors the bitline voltage generated by the bitline voltage generator.

17. The nonvolatile memory device of claim 12, wherein the detector monitors an output of the write driver.

18. The nonvolatile memory device of claim 12, wherein the detector monitors a voltage on a selected bitline.

* * * * *